United States Patent [19]

Ando et al.

[11] 4,276,275
[45] Jun. 30, 1981

[54] PROCESS FOR PREPARING ULTRAFINE CARBIDE POWDER

[75] Inventors: Yoshinori Ando, 1-17-1 Yamatedori, Showa-Ku, Nagoga-Shi, Aichi-ken, Japan; Sakae Inoue; Kiyotaka Takahashi, both of Kasugai, Japan

[73] Assignee: Yoshinori Ando, Japan

[21] Appl. No.: 94,000

[22] Filed: Nov. 14, 1979

[30] Foreign Application Priority Data

May 23, 1979 [JP] Japan .................................. 54-63521

[51] Int. Cl.³ ....................... C01B 31/36; C01B 31/30
[52] U.S. Cl. .................................... 423/345; 204/164; 204/173; 423/439; 423/440
[58] Field of Search ................ 204/164, 173; 423/345, 423/439, 440

[56] References Cited

U.S. PATENT DOCUMENTS

| | | | |
|---|---|---|---|
| 2,149,939 | 3/1939 | Kinzie et al. | 423/345 X |
| 4,152,194 | 5/1979 | Frosch | 423/345 X |
| 4,153,527 | 5/1979 | Greenewald | 204/164 |

OTHER PUBLICATIONS

Kosolapova, Carbides, pp. 191–199, Pub. by Plenum Press (1971).

*Primary Examiner*—F. Edmundson
*Attorney, Agent, or Firm*—Robert E. Burns; Emmanuel J. Lobato; Bruce L. Adams

[57] ABSTRACT

A process for preparing ultrafine carbide powder of silicon or titanium and other carbide which are used as refractory materials comprises the steps of passing electric current to a carbon member held in contact with a material such as silicon in a vacuum vessel into which an inert gas at a desired pressure is introduced and collecting a carbide powder of the material fuming into the gas as a result of a high-temperature reaction between the material and carbon member in contact, thus producing carbide powder of ultrafine particles and of high-purity with high efficiency. A preheater facilitates the passing of electricity through the material by reducing the resistance thereof and leads to efficient preparation of the ultrafine carbide powder.

6 Claims, 2 Drawing Figures

PROCESS FOR PREPARING ULTRAFINE CARBIDE POWDER

BACKGROUND OF THE INVENTION

This invention relates to a process for preparing ultrafine powder of such carbides as those of silicon and titanium which are used, for example, as refractory materials.

Conventionally, ultrafine powder of silicon, titanium and other carbides have been prepared by the vapor- and liquid-phase reaction methods. The ultrafine powder prepared by these methods, however, is not smaller than approximately 0.2 μm in diameter, and often contains impurities etc.

Ultrafine carbide powder is sintered into high-strength, heat-resisting materials. It has been known that the sintering temperature lowers with decreasing powder particle size, and that the product strength increases with decreasing impurities content.

Development of a process for preparing impurities-free ultrafine powder of smaller particle size has been desired.

SUMMARY OF THE INVENTION

To meet such needs, this invention has it as an object to provide a process for preparing ultrafine powder of silicon, titanium and other carbides, consisting of finer particles and containing less impurities than heretofore, in a vacuum vessel, by applying the so-called gas evaporation method.

To achieve the above object, the process of this invention comprises the steps of passing electric current to a carbon member held in contact with such a material as silicon and titanium in a vacuum vessel into which an inert gas at a desired pressure is introduced, and collecting powder of a carbide of said material that fumes into said gas as a result of a high-temperature reaction between said material and carbon member in contact.

Apparatus used for the above process comprises a vacuum vessel into which an inert gas at a desired pressure is introduced, means for grasping a carbon member so as to be capable of coming in contact with a desired material to produce a carbide of said material in said vacuum vessel, electric wiring for passing electric current to said material and carbon member in contact, elevating means for bringing and keeping said carbon member in contact with said material, and a heater for preheating said material.

DESCRIPTION OF PREFERRED EMBODIMENTS

Figure 1:
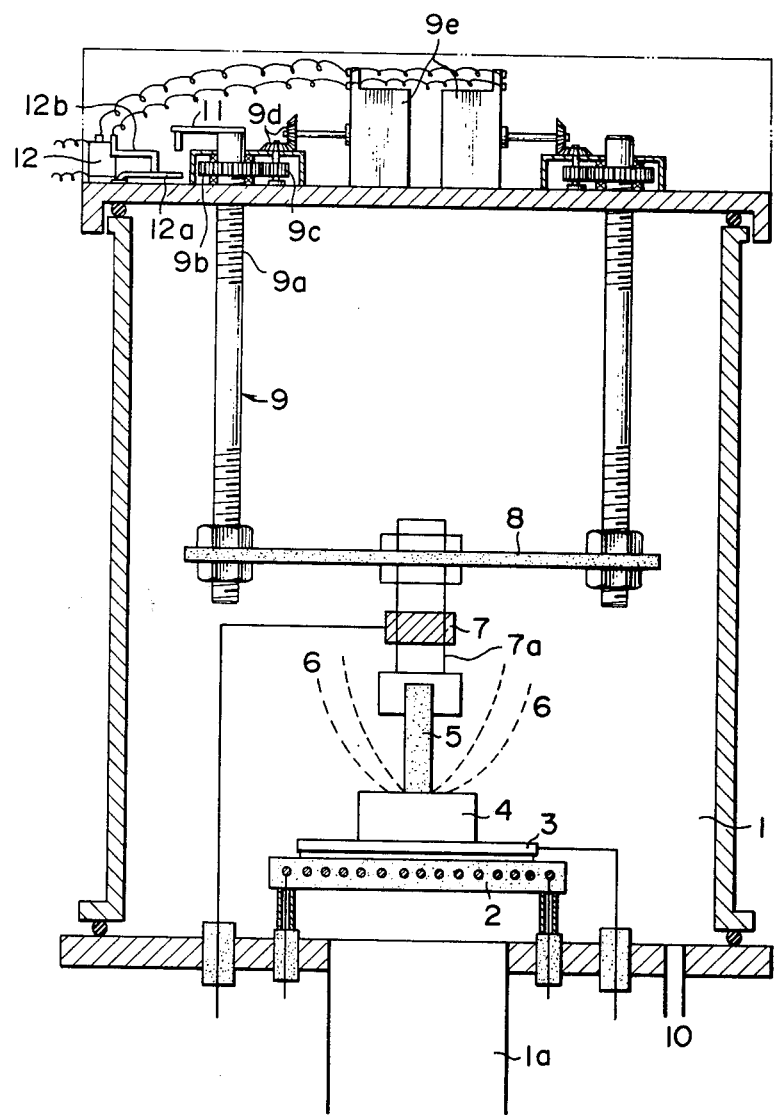
FIGS. 1 and 2 are vertical cross-sectional views of a first and a second embodiments respectively of the apparatus for preparing ultrafine powder of silicon carbide.

Referring now to FIG. 1, the first embodiment of this invention will be described in the following. A material solid silicon 4 is placed on a material preheating electric heater 2, with a lower electrode 3 therebetween, in a vacuum vessel 1. A rod- or plate-shaped carbon member 5, adapted to come in contact with the top surface of the silicon 4, is hangingly grasped by a metal grip 7a carrying an upper electrode 7. The grip 7a is supported by an elevating system 9 through an insulating plate 8. Accordingly, the elevating system 9 brings and keeps the carbon member 5 in contact with the silicon 4. The same result can be obtained by raising and lowering the silicon 4.

The air in the vacuum vessel 1 is withdrawn through a duct 1a by a vacuum pump not shown. Then, an inert gas, such as argon, or other desired gas is supplied through a gas-supply pipe 10 into the vacuum vessel 1, and kept at a desired pressure.

The elevating system 9 comprises an externally threaded rod 9a that is raised and lowered by means of a toothed nut 9b, engaging with said rod 9a and toothed on the periphery, driven by a motor 9e through a pinion 9c and bevel gears 9d.

To prevent falling off, the externally threaded rod 9a has a limit-switch actuating arm 11 at the uppermost end thereof. When the arm 11 descends to depress an elastic tongue 12a of a limit switch 12, the tongue 12a parts from a fixed contact 12b to cut the electricity supply, thereby stopping the motor 9e.

The paired motors 9e in the drawing are selsyn or other types of motors that can be rotated synchronously. A single motor can achieve the same result by actuating the elevating system 9 through an interlock mechanism.

The following describes how the process according to this invention is carried out with the above-described apparatus. First, the electric heater 2 is energized to preheat the solid silicon 4 through the lower electrode 3, thereby reducing the electric resistance of the silicon 4. Then the lower and upper electrodes 3 and 7 are energized to pass large current through the silicon 4 and carbon member 5. As a consequence, the carbon member 5 becomes white heat, and the silicon 4 fused in an area contacting the carbon member 5, reacting at high temperatures while wetting the carbon member 5 by the action of surface tension. Then a carbide of silicon, or a vapor or cluster of silicon carbide, is liberated.

The insert gas introduced in the vacuum vessel 1 converts the vapor or cluster of silicon carbide into fume-like ultrafine powder 6.

As the reaction proceeds, the elevating system 9 lowers the carbon member 5 into the fused portion of the silicon 4 so that the silicon 4 and carbon member 5 do not separate from each other.

Sticking to the inner wall of the vacuum vessel 1, the ultrafine powder 6 of silicon carbide thus produced is scraped together on completion of the reaction.

An experiment passing a current of approximately 100 amperes through a 3–5 mm diameter carbon rod, which served as the carbon member 5, resulted in the production of ultrafine powder consisting of particles ranging in diameter between approximately 50 and 1000 Å.

When such metal as titanium is used instead of silicon, adequate conductivity of the metal itself dispenses with the heating by the electric heater 2. But larger current should be supplied between the upper and lower electrodes 3 and 7 to fuse the metal in contact with the carbon member 5.

The particle size of the ultrafine powder 6 can be controlled by changing the kind and pressure of the gas introduced into the vacuum vessel 1 and the current passed to the electrodes 3 and 7.

Figure 2:
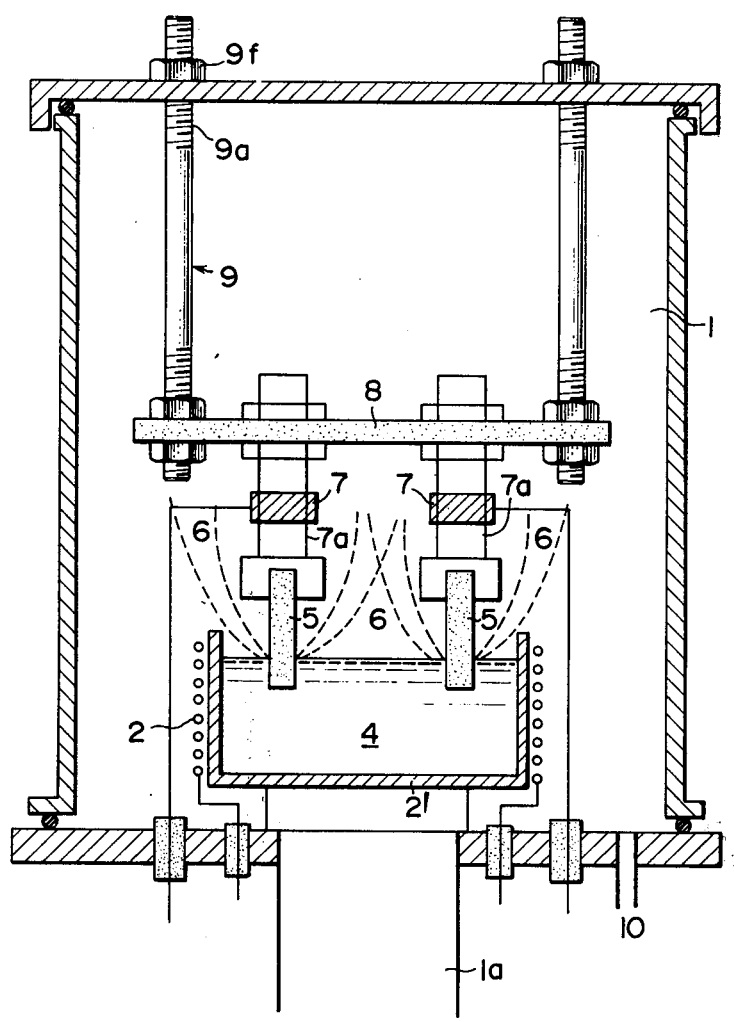

Now the second embodiment of this invention will be described in the following, referring to FIG. 2. The lower ends of paired rod- or plate-shaped carbon members 5 are immersed in silicon 4 that is fused in a crucible 2' having an electric preheater 2.

Electricity is passed to the silicon 4 and carbon member 5 by energizing paired upper electrodes 7. Namely, electric current flows from the upper electrode 7 on one material grip 7a through a carbon member 5 held thereby an the fused silicon 4 to the other carbon member 5 and electrode 7 on the other material grip 7a.

With the lower end of the carbon member 5 immersed in the fused silicon 4, initial lowering of an insulating plate 8 and the carbon member 5 by the adjustment of a nut 9f engaging with an externally threaded rod 9a saves frequent operation of an elevating system 9 of this second embodiment.

Using a plurality of carbon members 5, this second embodiment can liberate a large quantity of silicon carbide vapor or cluster, which is efficiently converted into ultrafine powder on being reacted with a gas held at a desired pressure in the vacuum vessel 1.

As in the case of the first embodiment described previously, the silicon carbide on the inner wall of the vacuum vessel 1 is scraped together.

As will be understood from the above, the carbide preparing process of this invention accelerates the reaction of such materials as silicon and titanium with carbon in a high-temperature condition produced by passing electricity, which permits efficient preparation of ultrafine carbide powder. During the course of this process, only a particular inert gas for converting the reaction product into ultrafine powder is introduced into the vacuum vessel serving as a reactor, in addition to such a material as silicon and the carbon member. This minimizes the probability of impurities mixing with the reaction product, thereby insuring the production of high-purity ultrafine carbide powder.

Possessing the elevating system to hold the carbon member at a desired level, the apparatus according to this invention always permits stable, sure contact of the carbon member with the material. The material preheater facilitates the passing of electricity through such materials as silicon by reducing the electric resistance thereof. This also leads to efficient preparation of ultrafine carbide powder.

What is claimed is:

1. A process for preparing ultrafine carbide powder, which comprises the steps of passing electric current to a carbon member held in contact with a metal selected from the group consisting of silicon and titanium in a vacuum vessel into which an insert gas at a desired pressure is introduced, and collecting powder of a carbide of said metal that fumes into said inert gas as a result of a high-temperature reaction between said metal and carbon member in contact therewith.

2. A process according to claim 1, in which said metal is molten.

3. A process according to claim 2 in which two carbon rods have their lower ends immersed in said molten metal, said current being passed into said molten metal through one and out through the other.

4. A process according to claim 1, in which said metal is preheated.

5. A process according to claim 1, in which said carbon member is progressively fed toward said metal to maintain contact therewith.

6. A process according to claim 1, in which said electric current has a value of the order of 100 amperes.

* * * * *